US009246074B2

(12) United States Patent
Kanada et al.

(10) Patent No.: US 9,246,074 B2
(45) Date of Patent: Jan. 26, 2016

(54) LIGHT EMITTING DEVICE (71) Applicant: NICHIA CORPORATION, Anan-shi, Tokushima (JP)

(72) Inventors: Morito Kanada, Tokushima (JP); Kensaku Hamada, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 2 days.

(21) Appl. No.: 13/751,790

(22) Filed: Jan. 28, 2013

(65) Prior Publication Data

US 2013/0193460 A1 Aug. 1, 2013

(30) Foreign Application Priority Data

Jan. 31, 2012 (JP) ................................. 2012-018763
Jan. 16, 2013 (JP) ................................. 2013-005160

(51) Int. Cl.
*H01L 33/62* (2010.01)
*H01L 27/15* (2006.01)
*H01L 33/48* (2010.01)
*H01L 25/075* (2006.01)

(52) U.S. Cl.
CPC ............... *H01L 33/62* (2013.01); *H01L 27/15* (2013.01); *H01L 33/486* (2013.01); *H01L 25/0753* (2013.01); *H01L 2224/48091* (2013.01); *H01L 2224/48137* (2013.01); *H01L 2224/48247* (2013.01); *H01L 2924/01322* (2013.01)

(58) Field of Classification Search
None
See application file for complete search history.

(56) References Cited

U.S. PATENT DOCUMENTS

| 8,324,654 | B2 | 12/2012 | An et al. | |
| 2008/0079019 | A1* | 4/2008 | Huang et al. | 257/99 |
| 2011/0175127 | A1* | 7/2011 | Kanada et al. | 257/98 |
| 2011/0215349 | A1* | 9/2011 | An et al. | 257/89 |

FOREIGN PATENT DOCUMENTS

| JP | 2008-153610 A | 7/2008 |
| JP | 2009-016636 A | 1/2009 |
| JP | 2011-178983 A | 9/2011 |
| JP | 2011-249807 A | 12/2011 |
| JP | 2011-256326 A | 12/2011 |

* cited by examiner

*Primary Examiner* — Johannes P Mondt
(74) *Attorney, Agent, or Firm* — Global IP Counselors, LLP (57) ABSTRACT

A light emitting device includes a plurality of light emitting elements, a plurality of lead frames, and a package. The light emitting elements are mounted on the lead frames. The package is made of resin. The package has an opening. A part of the lead frames is embedded in an inner portion of the package and another part of the lead frames is exposed on a bottom surface of the opening. A resin bottom surface on which the resin is exposed is provided on the bottom surface of the opening of the package. The package includes a wall portion projecting from the bottom surface of the opening between the light emitting elements in the opening. The light emitting elements are connected by wire that straddles the wall portion.

27 Claims, 3 Drawing Sheets

LIGHT EMITTING DEVICE

CROSS-REFERENCE TO RELATED APPLICATIONS

This application claims priority to Japanese Application No. 2012-18763 filed in Japan on Jan. 31, 2012 and Japanese Application No. 2013-5160 filed in Japan on Jan. 16, 2013. The entire disclosures of Japanese Application No. 2012-18763 is incorporated hereinto by reference.

TECHNICAL FIELD

The present invention relates to a light emitting device.

BACKGROUND

In recent years, high-intensity and high-output light emitting elements and miniature light emitting devices have been developed, and used in various fields. These light emitting devices are made full use of the characteristics such as small size, low power consumption and low weight, and for example, have been utilized for application as a light source in a liquid-crystal backlight and mobile telephones, a light source for various types of meters, and various types of scanning sensors. Various techniques have been designed to realize higher intensity illumination and reduce size (for example, JP 2011-249807A and JP2008-153610A, etc.).

As an example, a metal member used as a lead frame or a wire used in wire bonding which are composed of silver or a silver alloy have been used as a metal member or a wire. In this manner, a method has been proposed to suppress absorption of light by the light emitting element, and efficiently reflect and extract light.

In order to prevent sulfuration of the silver or the silver alloy, various proposals have been made in relation to a resin and a package material to seal the light emitting element (for example, JP 2011-256326A and JP2011-178983A etc.).

However, in general, when silver and a silver alloy are used as a material for a lead frame and a wire or the like, sulfuration of such members occurs and therefore causes absorption of the light from the light emitting element, with the result that there is the problem that efficient reflection of light is hindered.

Moreover even when a resin having a composition that enables highly effective suppression of sulfuration of silver is used, such sulfuration starts as a result of air or moisture or the like that enters into the tiny gaps between the resin and the resin, or between the resin and the lead frame, and expands, with the result that efficient sulfuration suppression is not realized.

SUMMARY

The present invention is proposed in relation to the problems above, and has the object of providing a light emitting device, by adoption of a structure that enables effective prevention of the occurrence of a gap between a resin and a resin or between a resin of a lead frame, wire or the like in the light emitting device, while at the same time realizing a reduction in the size and the thickness of the light emitting device, that hinders sulfuration of a metal member that contains silver that is used in the light emitting device, and that enables more efficient extraction of light emitted from a light emitting element due to its structure.

A light emitting device according to one aspect includes a plurality of light emitting elements, a plurality of lead frames, and a package. The light emitting elements are mounted on the lead frames. The package is made of resin. The package has an opening. A part of the lead frames is embedded in an inner portion of the package and another part of the lead frames is exposed on a bottom surface of the opening. A resin bottom surface on which the resin is exposed is provided on the bottom surface of the opening of the package. The package includes a wall portion projecting from the bottom surface of the opening between the light emitting elements in the opening. The light emitting elements are connected by wire that straddles the wall portion.

A light emitting device according to another aspect includes a plurality of light emitting elements, a plurality of lead frames and a package. The light emitting elements are mounted on the lead frames. The package is made of resin. The package has an opening. A part of the lead frames is embedded in an inner portion of the package and another part of the lead frames is exposed on a bottom surface of the opening. The package includes a wall portion projecting from the bottom surface of the opening between the light emitting elements in the opening. The light emitting elements are connected by wire that straddles the wall portion, with the wire being made of silver or a silver alloy.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF THE EMBODIMENTS

The embodiments will now be described with reference to the accompanying drawings, wherein like reference numerals designate corresponding or identical elements throughout the various drawings.

Figure 1A:
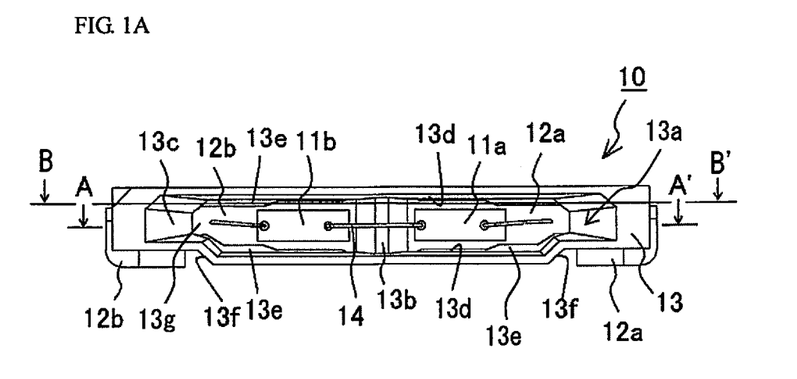
FIG. 1A is a schematic plan view seen from a light extraction surface (light emitting surface) to describe the light emitting device according to the present embodiment.
Figure 1B:
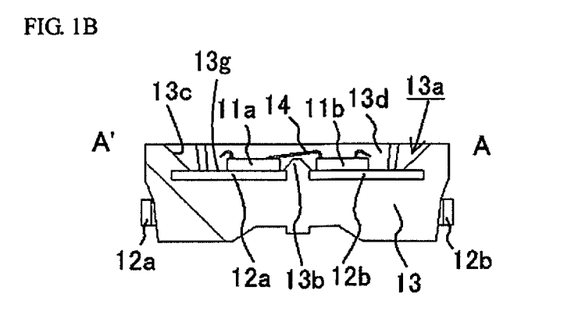
FIG. 1B is a sectional view along the line A-A' of the light emitting device illustrated in FIG. 1A.
Figure 1C:
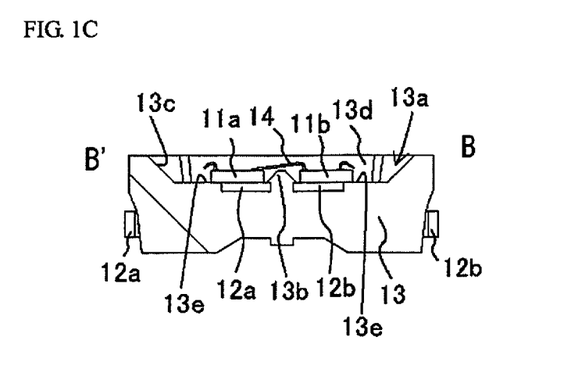
FIG. 1C is a sectional view along the line B-B' of the light emitting device illustrated in FIG. 1A.
Figure 2A:
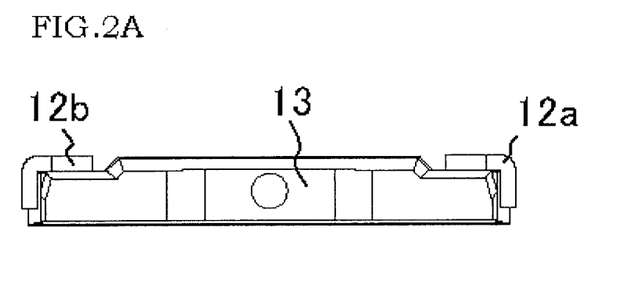
FIG. 2A is a side view of the light emitting device illustrated in FIG. 1A.
Figure 2B:
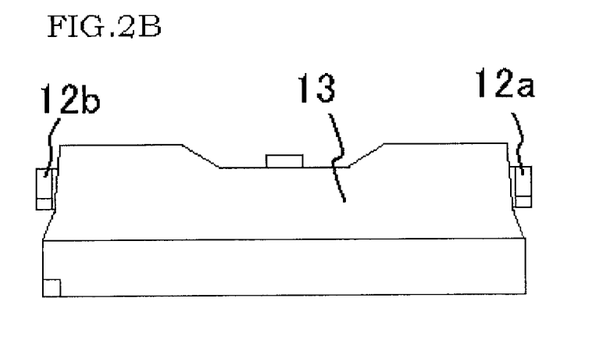
FIG. 2B is an upper view of the light emitting device illustrated in FIG. 1A.
Figure 2C:
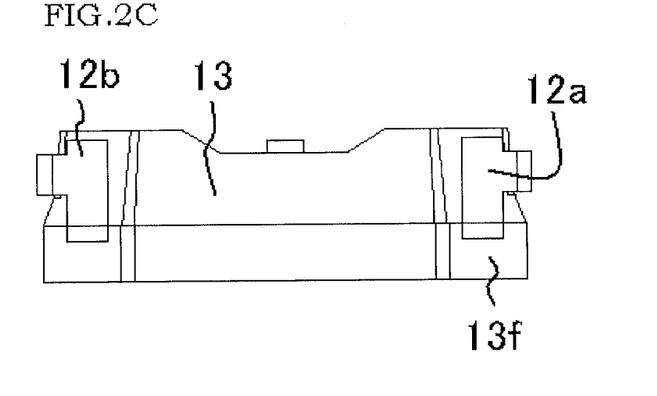
FIG. 2C is a bottom view of the light emitting device illustrated in FIG. 1A.
Figure 2D:
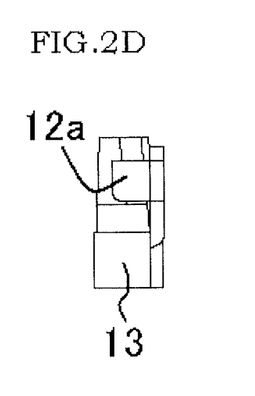
FIG. 2D is a side view of the light emitting device illustrated in FIG. 1A.

The light emitting device according to the present embodiment as illustrated in FIG. 1 for example is mainly configured by a plurality of light emitting elements 11a, 11b, lead frames 12a and 12b, and a package 13. This type of light emitting device is preferably a so-called side-view light emitting device. That is to say, it is preferred that the device can be mounted as a light emitting device that includes a light emitting surface (light extraction surface, below may be referred to as an "upper surface") that is oriented in a substantially perpendicular direction to a mounting surface.

According to the light emitting device of these aspects, it is possible to provide a high quality light emitting device that realizes more high intensity, while at the same time realizing reductions in the size and the thickness of the light emitting device, and that enables effective prevention of the occurrence of a gap between a resin and a resin or between a resin of a lead frame, wire or the like in the light emitting device, and thereby that prevents sulfuration or corrosion of a metal member which configures the package or is present in the package.

Light Emitting Element

The light emitting element is typically a semiconductor light emitting element, and in particular, may take any configuration as long as an element termed a light emitting diode is used. Examples include a laminated structure formed on a substrate by use of various semiconductors such as a nitride semiconductor including InN, AlN, GaN, InGaN, AlGaN, InGaAlN or the like, a group III-V semiconductor, a group II-VI semiconductor, or the like, and included an active layer. The structure of the semiconductor includes a homostructure including a MIS junction, a PIN junction, a PN junction or the like, or a heterostructure or a double heterostructure. Furthermore, the semiconductor active layer may be formed as a single quantum well structure or a multiquantum well structure in a thin film that produces a quantum effect. The active layer may be doped with a donor impurity such as Si, Ge or the like and/or an acceptor impurity such as Zn, Mg or the like. The emitted wavelength of the resulting light emitting element may be varied from ultraviolet to red by varying the type of impurity that is doped into the active layer, the content amount of In contained in InGaN in the active layer, the mixed crystal ratio and the material of the semiconductor.

The light emitting element is mounted on the lead frame described below, and thus a bonding member is used. For example, an epoxy resin, silicone, or the like can be used when the light emitting element includes blue and green light emission, and is formed by growing a nitride semiconductor on a sapphire substrate. Furthermore, when the deterioration due to light or heat from the light emitting element is considered, aluminum plating may be applied to the back surface of the light emitting element, and in substitution for use of a resin, soldering with an Au—Sn eutectic crystal, or a brazing filler metal such as a low melting point metal may be used. Furthermore, when a light emitting element is used in which electrodes are formed on both surfaces such as a light emitting element that emits red light and is formed from GaAs, die bonding may be performed by use of a conductive paste or the like such as silver, gold or palladium.

A plurality of two or more light emitting elements may be mounted on the light emitting device according to the present embodiment. In this case, a plurality of light emitting elements that emit a light of different emitted colors may be combined, and a plurality of light emitting elements that emit a light of the same emitted color may be combined. For example, by combining a plurality of light emitting elements having different light emission colors in compliance with RGB, it is enabled to enhance color reproduction performance. Furthermore, luminous intensity can be enhanced by combining a plurality of light emitting elements having the same light emission color.

The light emitting elements are mounted on the light emitting device by a face-up mounting or flip-chip mounting, or the like. However, it is preferred to use a face-up mounting, that is to say, a configuration in which a pair of electrodes is formed on the same surface relative to the substrate of the light emitting element (or semiconductor layer), and the surface on which the electrodes are formed is mounted towards the light emitting surface.

In this case, typically, on the light emitting element, pad electrodes corresponding to the electrodes are formed to wire bond the pair of electrodes. It is preferred that one of the pad electrodes is in proximity to the outer periphery of the light emitting element, and the other is biased toward the inner side of the light emitting element. The disposition of this type of pad electrodes provides uniform electrical power to the semiconductor layer that configures the light emitting element while minimizing absorption by the wire of light that is emitted from the light emitting element.

In consideration of the bonding characteristics with wire, the uppermost surface of the pad electrode is preferably formed from gold, platinum, aluminum, rhodium, iridium, ruthenium, silver or an alloy of these metals, and more preferably is formed from gold, platinum, aluminum or an alloy of these metals.

Lead Frame

The lead frame is a member configured to mount the light emitting elements. Furthermore, the lead frame has the role of a lead terminal and an electrode that is electrically connected with the light emitting element. For this, a portion of the lead frame is embedded and fixed to an inner portion of the package as described below, another portion is exposed in the opening (of the bottom surface) of the package to dispose and enable electrical connection of the light emitted elements, and a further portion projects outwardly from inside the package. The exposure of a part of the surface of the lead frame on the bottom surface of the opening enables reflection of light from the light emitting element and efficient extraction in the forward direction.

As described below, the lead frame that is exposed on the bottom surface of the opening may be configured with a different width either in accordance with the shape of the opening or without reference to the shape of the opening. In such a configuration, it is preferred that the width is small at the terminal of the opening and increases in accordance with an orientation toward the central portion. The fluctuation in the width is within a scope that enables maintenance of the function as an electrode and a lead terminal that supplies electrical power as described above, and for example, includes a width fluctuation of within 30%, and preferably within 20% relative to the maximum width.

The lead frame is typically provided as at least two on one light emitting device, and furthermore, may be configured as the number of light emitted elements+1, or double or more of the number of light emitted elements. For example, when mounting two light emitted elements, a single light emitting element is mounted on both of the two lead frames, respectively, one light emitting element is connected electrically by one electrode with the lead frame that mounts this light emitting element, and the other light emitting element is connected electrically by one electrode with the other lead frame that mounts that other light emitting element, and the electrodes of the light emitted elements not connected with the lead frame are connected electrically to each other.

Those lead frames that are not connected electrically with the electrode of the light emitted element as described above are disposed in the package in a substantially electrically separated.

The lead frames may be substantially in the form of plate, or may be in an undulating or an uneven plate shape. There is no particular limitation in relation to the material, and any material may be used that enables supply of suitable electrical power to the light emitting element. Furthermore, formation using a material that has a comparative large coefficient of thermal conductivity is preferred. Formation using such material enables efficient escape of heat produced by the light emitting elements. For example, it is preferred to use a configuration that has a coefficient of thermal conductivity of about 200 W/(m·K) or more, a configuration that has comparative high mechanical strength, or a material that can be easily subjected to punch-pressing processing, etching processing or the like. More specifically, the material includes a metal such as copper, aluminum, gold, silver, tungsten, iron, nickel or the like, or an alloy such as an iron-nickel alloy, phosphor bronze or the like, and the like. Furthermore, the surface of the lead frame is preferably subjected to reflective plating (for example, using a silver or silver alloy) in order to enable efficient extraction of light from the light emitting elements that are mounted thereon. The size, thickness, shape or the like of the lead frame may be suitably adjusted with reference to the size, shape or the like of the target light emitting elements.

The shape, size or the like of the positions of the lead frames that extend beyond the package (that is to say, the lead terminals) may be suitably adjusted with reference to the heat radiation characteristics of the light emitting elements mounted on the light emitting device and the use configuration of the light emitting device (the installation space, the installation position, or the like). Furthermore, the lead terminals may be suitably deformed or curved in response to the use configuration such as the positional relationship with other electronic devices.

The lead frame may be configured to only mount the light emitting elements without being electrically connected to the light emitting elements, or not mount the light emitting elements and not be electrically connected with the light emitting elements. It is preferred that one end of this type of lead frame has a surface area that is larger than the portion that functions as the lead terminal. In this manner, a function as a heat radiation pathway for guiding heat generated by the light emitting elements in the package to the outside, or a function as a provision for overvoltage can be provided.

Package

The package is a member that is integrally fixed to the lead frame, protects the light emitting elements and ensures insulation characteristics in relation to the light emitting element and the lead frame.

For this purpose, the package may be formed from any material which may be used to the extent that it allows maintenance of such functions. For example, the material includes a resin such as a thermoplastic resin, a thermocuring resin, or the like, and a ceramics. More specifically, examples of the resins include polyimide (PI), polyamide (PA), polycarbonate resin, polyphenylene sulfide (PPS), liquid crystal polymer (LCP), ABS resin, epoxy resin, phenol resin, acrylic resin, PBT resin, resins that are used as package materials in this field (see, for example, the resins disclosed in JP2011-256326A, JP2011-178983A, or the like), and the like. Furthermore, various types of dyes, pigments or the like may be mixed and used in relation to these materials as coloring agents or light dispersing agents. In this manner, a white package can be configured with high reflectance or to minimize absorption by the package of the light emitted from the light emitting element. The coloring agents include $Cr_2O_3$, $MnO_2$, $Fe_2O_3$, carbon black or the like. The light dispersing agents include calcium carbonate, aluminum oxide, titanium oxide, or the like.

Since a transparent resin is typically embedded in the opening as described below, in consideration of the sealing characteristics of the translucent resin and the package when affected by heat produced by the light emitting elements or the like, it is preferably selected from substances that exhibit a small difference in relation to the coefficient of thermal expansion.

There is no particular limitation in relation to the shape and size of the package, and the outer shape (planar shape) when viewed in plan may include a circle, oval, triangle, quadrilateral, polygon or shape approximating these shapes. Of such shapes, a shape that extends in a longitudinal direction is preferred, and in particular, a shape that extends in a longitudinal direction and is a quadrilateral, or approximates a quadrilateral when viewed in plan is preferred.

Opening

An opening is formed on the surface of the package, and the opening is formed to mount the light emitting elements, and extract light from the light emitting elements. There is no particular limitation in relation to the shape of the opening, and the shape may include a column of circle, oval, triangle, quadrilateral, polygon, a dome, a bowl-shaped, or a shape that approximates such shapes. Of such shapes, a shape that extends in a longitudinal direction is preferred, and in particular, a shape that extends in a longitudinal direction and is a quadrilateral, or approximates a quadrilateral when viewed in plan is preferred.

When the opening is provided along the longitudinal direction, the width of the opening may differ in the longitudinal direction, or may be substantially the same.

Figure 3:
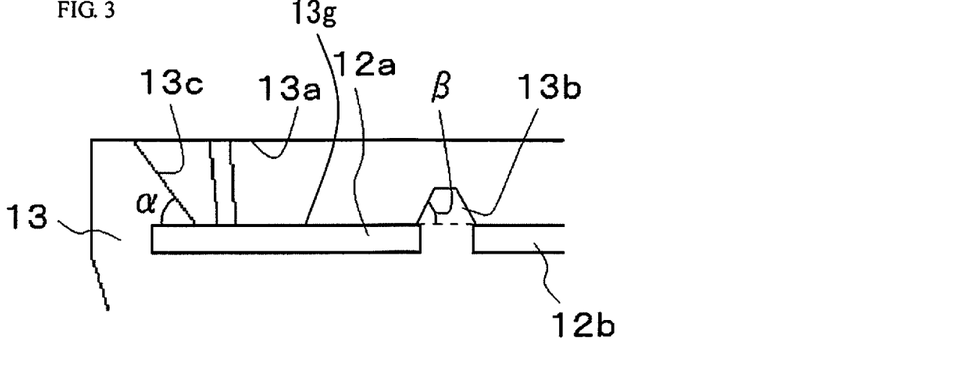
FIG. 3 is a schematic sectional view of the light emitting device that describes the inclination of the opening short side surface and the wall portion of the present embodiment.

The opening preferably has one or a pair of long side surfaces that are provided along the longitudinal direction. Furthermore, The opening preferably has one or a pair of short side surfaces that extend along the intersectional (transverse) direction to the longitudinal direction. The side surfaces of an opening that include long side surfaces and/or short side surfaces as described above may be perpendicular, or a part or the whole may be inclined so that the width of the opening constantly decreases towards the bottom surface. This type of inclination enables efficient reflection of light reflected from the light emitting elements in the direction of the extraction surface (upward direction). This type of side surface may be inclined at a different angle of inclination depending on the position. For example, it is preferred that the inclination angle of the side surface is minimized at the terminal portion in the longitudinal direction (for example, the short side surface). When the angle of inclination of the short side surface (the inclination angle alpha on the short side surface 13c) is smaller than the angle of inclination of the long side surface, the height on the mounted light emitting device can be set to a minimum value, and light can be efficiently reflected at the longitudinal terminal portion to thereby enhance light emission. For example, it is preferred that the angle of inclination of the short side surface (alpha in FIG. 3) is about 30 to 70 degrees relative to the opening bottom surface, and about 40 to 60 degrees being more preferred. It is preferred that the angle of inclination of the long side surface is larger than the above angles. The increase in the occupied space of the light emitting device resulting from such inclination can be therefore minimized.

The size and depth of the opening can be suitably adjusted depending on the number of mounted light emitting elements, the bonding method or the like. For example, a depth of about 1.5 to 10 times the thickness of the light emitting elements above is preferred, about 1.5 to 5 times, or about 2 to 5 times is more preferred. More specifically, examples of the depth include about 0.1 to 1 mm, about 0.2 to 0.6 mm, and more preferably about 0.25 to 0.35 mm. The bottom surface and/or side surface of the opening is preferable such that its bonding area is increased to enhance the bonding and sealing characteristics with the translucent resin described below, by an emboss processing, a plasma processing or the like.

The wall portion preferably has a height that is equal to or is lower than the mounted light emitting element. This is because the space that configures the opening is easily partitioned, and the wire can be formed stably, without deepening the opening.

Opening Inner Wall Portion

The package includes a wall portion disposed in the opening to project from the bottom surfaces of the opening between the mounted light emitting elements. One or a plurality of wall portions may be provided depending on the number of light emitting elements. The provision of the wall portion in the opening enables partition of the space that configures the opening, and as described below, typically, the reduction in the space enables effective suppression of the thermal expansion or contraction of the translucent resin embedded in the opening.

The wall portion is preferably disposed between the lead frames (see the wall portion 13b in FIG. 1B). In other words, use of the wall portion preferably creates a substantial electrical separation of the lead frames. However, as long as the wall portion is positioned between the lead frames, and a part thereof may extend onto the lead frames (see the wall portion 13b in FIG. 1B). When a part of the wall portion extends onto the lead frames, the sealing characteristics with the resin that configures the package and the lead frame are enhanced, and more robust fixture of the lead frame to the package is enabled.

The wall portion is preferably connected to both of the pair of long side surfaces provided along the longitudinal direction of the opening that is disposed in the package that extends in the longitudinal direction. In this manner, the connection of the wall portion to the long side surface enables partitioning of the space that configures the opening, and typically, the reduction in the space enables effective suppression of the thermal expansion or contraction of the translucent resin embedded in the opening.

Furthermore, it is preferred that the width of the wall portion increases towards the bottom surface. As described above, the width increase in this configuration is preferably greater in the longitudinal direction when the wall portion is connected to the long side surfaces. Although it is preferred that the overall wall portion in the height direction is connected to the long side surfaces, connection to the long side surfaces may be made with respect to the bottom surface of the opening and adjacent thereto, or with a portion below the wall portion height. In this configuration, the width of the wall portion may increase relative to the direction of connection with the pair of long side surfaces (the direction of intersection relative to the direction of extension of the long side surfaces) as the bottom surface is approached.

The increase in the width of the wall portion with respect to the longitudinal direction for example is preferably configured so that the angle of inclination of the wall portion side surface (the inclination angle beta of the wall portion 13b in FIG. 3) is about 40 to 70 degrees, and more preferably about 50 to 60 degrees, relative to the opening bottom surface. This inclination angle enables efficient reflection in the extraction direction of light from the light emitting elements illuminated onto the wall portion. However, it is preferred that the angle of inclination of the wall portion side surface (beta in FIG. 3) is greater than the angle of inclination (alpha in FIG. 3) of the terminal portion side surface in the longitudinal direction (short side surface 13c).

For example, although the size of the wall portion may be suitably adjusted with reference to the size of the light emitting device in which it will be used, a width of about 0.05 to 0.2 mm on the upper surface portion, a width of about 0.3 to 0.5 mm on the bottom surface portion, and a height of about 0.1 to 0.17 mm are included therein.

Opening Bottom Surface

The bottom surface of the opening includes a resin bottom surface that exposes resin in addition to a part of the surface of the lead frame. It is preferred that the resin bottom surface is disposed along the long side surface or adjacent to the long side surface. The resin bottom surface may be configured with a length of about 30 to 100%, preferably about 40 to 90% and still more preferably about 50 to 80% of the length of the long side surface. The disposition of this resin bottom surface enhances the tight sealing of the package resin with the translucent resin described below. In particular, when the resin is exposed to the opening bottom surface, the interface of the three layers formed by the resin that configures the package, the lead frame and the translucent resin described below is not positioned at an edge portion, therefore, even if peeling or a minute space(s) is caused between the resin that configures the package and the translucent resin, contact of the lead frame with moisture, gas or dust that can be entered through the space(s) can be effectively prevented, and thereby the sulfuration problem of silver is extremely effectively prevented.

For example, the width of the resin bottom surface is suitably about 1 to 30%, and about 2 to 20% of the maximum width of the opening. Furthermore, the resin bottom surface is preferred such that the width is different with respect to the longitudinal direction. The width difference in the longitudinal direction preferably fluctuates within the above range, and in particular, the width of the resin bottom surface at the lowest width is preferably about 10 to 50%, and more preferably about 20 to 40% of the greatest width of the resin bottom surface.

In particular, the width of the resin bottom surface is preferably differed from the position of the terminal in the longitudinal direction towards the wall portion that projects from the bottom surface of the opening as described below, and preferably the width decreases as the wall portion is approached.

However, as described above, when the wall portion that projects from the bottom surface is formed in the opening of the package, the resin bottom surface may not exist at the wall portion or at a bottom surface position adjacent to the wall portion, even in relation to a position along the long side surface or adjacent to the long side surface. In other words, the position of the bottom surface of the opening adjacent to the wall portion is preferably occupied by the exposed surface of the lead frame.

The resin bottom surface along the long side surface or adjacent to the long side surface may be partitioned two or more times in the longitudinal direction. The provision of the wall portion enables effective prevention of peeling of the translucent resin and the resin that configures the package in proximity to the wall portion. That is to say, as described below, although the translucent resin generally exhibits a tendency to undergo thermal expansion or contraction in comparison to the resin that configures the package, since the translucent resin can be defined from three directions in proximity to the wall portion, thermal expansion or contraction of a degree that causes peeling can be suppressed.

Outer Wall

The package is preferably formed a recessed portion on a part of the outer surface. The recessed portion may be formed to extend to the inner surface (opening) of the wall of the package, and a projection is formed on the inner surface (opening). The formation of the recessed portion enables more effective use of the space that is available in the light emitting device (for example, dead space) and further enhances the miniaturization of the light emitting device.

Although there is no particular limitation on the size or shape of the recessed portion, a space that can accommodate a portion of the lead frame which projects to the outside of the package in the recessed portion may be ensured. Furthermore, it is preferred that the space accommodates a portion of the lead frame in the recessed portion, and enables a portion of the surface of the lead frame to face the outer surface of the wall of the package. In this context, the term "face" means a planar configuration that enables electrical contact and stable fixation of a circuit board and the lead terminal simply by installation on a mounting board such as the circuit board or the like. As illustrated in FIG. 1A and FIG. 2, the feature of a portion of the lead frame accommodated in the recessed portion includes formation of the recessed portion 13f by formation of a notch in a so-called corner portion of the package 13, and disposing a portion of the lead frame in the recessed portion 13f.

In addition to the light emitting elements, protective elements may be mounted on the light emitting device according to the present embodiment. Only a single protective element may be provided, or a plurality of two or more may be provided. As used herein, there is no particular limitation in relation to the protective element, and includes any known element mounted in a light emitting device. More specifically, it includes overheating, overvoltage and overcurrent protective elements, protective circuits, electrostatic protective elements, or the like.

Translucent Resin

In the light emitting device according to the present embodiment, a translucent resin is preferably embedded in the opening that mounts the light emitting elements.

The translucent resin is a member that seals the light emitting elements, wire and a portion of the conductive member, and thereby provides protection from dust, moisture and external forces. The base material of the translucent resin is preferably a material that enables transmission of light emitted from the light emitting elements (preferably with a transmittance of at least 70%).

More specifically, the resin includes an addition or condensation silicone resin, an epoxy resin, a phenol resin, a polycarbonate resin, an acrylic resin, ABS resin, a poly (butylene terephthalate) resin, a polyphthalamide resin, a polyphenylene sulfide resin, liquid crystal polymer, or a hybrid resin that contains one or more types of the these resins.

The translucent resin preferably includes a metal salt and/or a metal complex including zinc in the above base material. The inclusion of zinc enables effective trapping in particular of gas that contains sulfur atoms, and thereby enables suppression of sulfuration of the silver.

Examples include a zinc salt of a phosphate ester or phosphate salt, an acid of a zinc salt of a phosphate ester or phosphate salt, or a zinc complex that includes an ester as a ligand.

More specifically, it is preferred that carboxylate salts such as zinc bis-acetylacetonate, zinc bis(2-ethylhexanoate), zinc (meth)acrylate, zinc neodecanate, zinc white, or zinc stannate are included.

The use of the above type of translucent resin enables dramatic suppression of a sulfur containing gas reaching the silver or silver alloy that is used as a galvanizing metal of the lead frame, the surface of the lead frame or wire and causing sulfuration.

The translucent resin includes the resins disclosed in JP2011-256326A, JP2011-137140A, JP2011-178983A, or the like.

The translucent resin may contain a dispersing agent or a fluorescent substance. The dispersing agent can disperse light, moderate the directivity from the light emitting element and increase the field of vision. The fluorescent substance converts the light from the light emitting element to thereby enable conversion of the wavelength of the light that is emitted from the light emitting element to the outside of the package. When the light from the light emitting element is visible light in a high-energy short wavelength, various organic fluorescent substances such as a perylene derivative, or inorganic fluorescent substances such as $ZnCdS:Cu$, $YAG:Ce$, nitrogen-containing $CaO-Al_2O_3-SiO_2$ activated by Eu and/or Cr are suitably applied. In the present embodiment, when white light is obtained, in particular a $YAG:Ce$ fluorescent substance is used, light from a blue-colored light emitting element and yellow light which is complementary color followed by absorption of a part of the blue light can be emitted in response to the content amount of the fluorescent substance, and thus white light can be formed reliably with a comparatively simple way. In the same manner, when nitrogen-containing $CaO-Al_2O_3-SiO_2$ activated by Eu and/or Cr is used, light from a blue-colored light emitting element and red light which is complementary color followed by absorption of a part of the blue light can be emitted in response to the content amount of the fluorescent substance, and thus white light can be formed reliably with a comparatively simple way. Furthermore, color unevenness can be reduced by completely precipitating the fluorescent substance and removing air bubbles.

In particular, the coefficient of elasticity of the translucent resin is preferably no greater than 10 MPa (10 MPa or smaller), and for example is preferably 0.1 to 10 MPa, 0.2 to 5 MPa. As used herein, the coefficient of elasticity means a value that is measured with reference to a method according to JIS K 6911 or JIS K 6249. A configuration with reference to this coefficient of elasticity enables prevention of peeling in the opening, in particular in the longitudinal direction terminal portion of the opening and enables relaxation of the stress applied to the wire or the like.

The light emitting device according to the present embodiment may be configured with a protective film to cover the surface of the wire, the light emitting element, and the lead frame prior to sealing with the translucent resin. The protective film is preferably formed with a film thickness and a material that exhibits low absorption characteristics of light of the wavelength emitted from the light emitting element in order to minimize the absorption of light emitted from the light emitting element. Examples of an oxide film include $Al_2O_3$, $SiO_2$, HfO, $TiO_2$, $SiO_xN_y$, or the like, and examples of a nitride film include SiN, TiN or the like. Such films may be provided as a single layer film or as a laminated film. Of the above, alumina, silica or an oxide film material that contains these compounds are preferred. Furthermore, the film thickness is preferably at least about 3 nm and no more than about 1 micrometer. The protective film can be formed using a method that is known in this field, and for example is preferably formed using an atomic layer deposition (ADL) method.

Wire

According to the light emitting device of the present embodiment, the pair of electrodes formed on the light emitting element is electrically connected by a wire to the lead frame and/or the electrodes of the adjacent light emitting element in order to supply electrical power to the light emitting element.

There is no particular limitation on the material or diameter of the wire, and a configuration that is normally used in this field may be used. In particular, a configuration with superior ohmic characteristics with the electrode of the light emitting element, a configuration with superior mechanical connectivity, and a configuration with superior electrical conductivity and thermal conductivity are preferred.

The wire, for example, may be formed from a metal such as gold, copper, platinum, aluminum, silver or the like, or an alloy of such metals, a configuration in which silver or a silver alloy is used to cover the wire surface, or the like. Of the above, silver, copper, lead, aluminum, platinum or an alloy of such metals as a high reflectance material are preferred, and silver or a silver alloy is still more preferred. An example of a wire includes a commercially available wire (product name: SEA manufactured by Tanaka Kikinzoku Kougyou Co., Ltd.) that has 87.7 volume % of silver, 8.7 volume % of gold and 3.6 volume % of palladium.

There is no particular limitation on the wire diameter, and the diameter includes about 10 micrometers to 70 micrometers, diameter of about 15 micrometers to 50 micrometers being preferred, and a diameter of about 18 micrometers to 30 micrometers being more preferred.

A coefficient of thermal conductivity of about at least 0.01 cal/S·cm$^2$·° C./cm is preferred, and at least 0.5 cal/S·cm$^2$·° C./cm being more preferred.

Typically, the wire adopts various configurations in the light emitting device depending on the bonding method thereof. In the present embodiment, a wire that connects the interval between light emitting elements is preferably configured to connect by straddling the wall portion disposed in the opening as described above. By straddling the wall portion at a position where the above sealing translucent resin in the opening is considered to undergo maximum thermal expansion or thermal contraction, the thermal expansion or thermal contraction can be suppressed by the provision of the wall portion and therefore enables relaxation of the stress applied to the wire.

The highest position of the wire is preferably biased towards one bonding point in the connection between the electrodes of the light emitting elements, or between the electrode of the light emitting element and the lead frame, that is to say, in the connection between the bonding points. At the bonding between the electrodes of the light emitting elements, the highest position of the wire is more preferably biased towards one light emitting element.

Figure 4A:
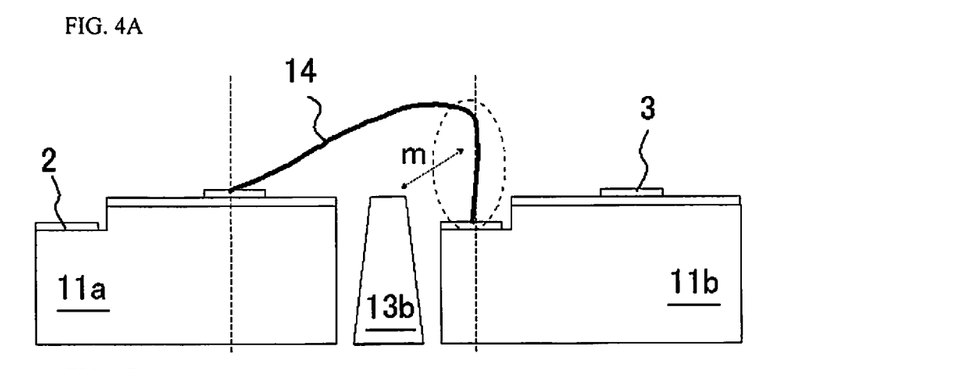
FIGS. 4A and 4B are schematic sectional views of the light emitting devices that describe the connection configuration of the wire between the light emitting elements in the light emitting devices of the present embodiment.

For example, as shown in FIG. 4A, the n side pad electrodes 2 are in proximity to the outer periphery of the light emitting elements 11a, 11b, respectively, the p side pad electrodes 3 are biased towards the inner side of the light emitting elements 11a, 11b above light emitting region, respectively. The n side pad electrode which is positioned in proximity to the outer periphery of one the light emitting element 11b (that is a first wire bonding point) is adjacent to the wall portion formed in the opening, and straddles the wall portion 13b to be bonded with the p side pad electrode 3 which is biased towards the inner side of another light emitting elements 11a (that is a second wire bonding point). Further a highest position of the wire 14 is biased towards the side of the light emitting element 11b which is bonded to the n side pad electrode in proximity to the outer periphery. By such wire configuration, a rising portion of the wire from the n side pad electrode 2, that is, a portion which extends upward, can be stably formed. Although the rising portion is a portion which exhibits a tendency to break, by aligning the rising portion in proximity to the wall portion 13b (distance m is set short as shown in FIG. 4A), thermal expansion or contraction of the translucent resin at the periphery of the wall portion can be suppressed and thus breaking of the rising portion of the wire effectively is prevented.

On the other hand, as shown FIG. 4A, the highest position of the wire 14 which bonds between the light emitting elements is biased towards a side of the light emitting element 11a that is bonded to the p side pad electrode 3 formed on the inner side of a light emitting region on the same configuration of the light emitting element and the wall portion as shown FIG. 4A. By such configuration of the wire, when a reflective wire is used as the wire, a rising portion from the p side pad electrode, that is the wire which is positioned above the light emitting region, prevents absorption of light by the wire, and extraction of light is effectively improved through reflection by the wire (see q in FIG. 4B). Although the pad electrode generally does not easily transmitted light, since the reflective wire extending upward of the pad electrode (that is, disposing the rising portion on the p-side pad electrode 3 side) can increase the proportion of the wire on the pad electrode, the reduction in light transmittance through the pad electrode is compensated by the reflection of the light on the wire extending upward, therefore a substantially uniform light distribution can be realized.

The detailed description of the embodiments of the light emitting device according to the present embodiment will be described below making reference to the figures.

Embodiment 1

As illustrated in FIG. 1A, 1B and FIG. 2, a light emitting device 10 according to the present embodiment is mainly configured by a plurality of light emitting elements 11a, 11b, lead frames 12a, 12b and a package 13, and is configured in a side view type.

The light emitting elements 11a, 11b for example are disposed in the order of n-type semiconductor layer, light emitting layer and p-type semiconductor layer on a substrate. The surface of the n-type semiconductor layer is partially exposed, and an n-type electrode is formed on the surface, with an n-type pad electrode disposed thereon. A p-type electrode is formed on substantially the whole surface of the p-type semiconductor layer, a p-type pad electrode is disposed thereon, they are disposed in a face-up mounting configuration on the lead frames 12a, 12b.

The lead frames 12a, 12b mount the light emitting elements, and include a region that is electrically connected with the light emitting element, a region that is embedded and fixed into the package 13, and a region that functions as a lead terminal by projecting from the fixing region to the outside of the package. The lead frames 12a, 12b are formed as a plate body from a copper-iron alloy, and are subjected thereon to silver plating to enable efficient extraction of light from the mounted light emitting elements.

The lead frames 12a, 12b that function as the lead terminal are curved and processed to be accommodated in a recessed portion 13f provided on the terminal of the package in the longitudinal direction on the outer portion of the package.

The lead frames 12a, 12b are respectively separated by wall portions described below by a resin that configures the package.

The package 13 extends in the longitudinal direction to form substantially a rectangular solid, and includes an opening 13a that extends in the longitudinal direction on the light extraction surface (that is to say, the upper surface). The opening 13a is defined by a bottom surface 13g, a pair of long side surfaces 13d that extends in the longitudinal direction, and a pair of short side surfaces 13c that extends in the transverse direction.

The opening 13a includes the wall portion 13b that projects from the bottom surface 13g.

The depth of the opening 13a is for example about 0.32 to 0.35 mm, and the height of the wall portion 13b is about 0.12 to 0.15 mm.

The wall portion 13b is connected to the pair of long side surfaces 13d at a position substantially adjacent to the center of the long side surfaces 13d of the opening 13a. The wall portion 13b increases its width in the longitudinal direction towards the bottom surface 13g (see 13b in FIG. 1B and FIG. 3). For example, the wall portion 13b is set to have a width of about 0.1 mm at the upper surface, and about 0.4 mm at the bottom surface 13g.

On the bottom surface 13g of the opening 13a, the lead frames 12a, 12b are exposed, and the resin bottom surface 13e that extends in the longitudinal direction is disposed adjacent to the long side surface 13d in the longitudinal direction of the opening 13a.

The lead frames 12a, 12b are exposed at a position adjacent to the wall portion 13b with a width that is the same as the width of the bottom surface 13g of the opening 13a. The width of the lead frames 12a, 12b differs in two stages from the wall portion 13b toward the longitudinal terminal portion, that is to say, the width decreases towards the longitudinal terminal portion. For example, the width decreases from about 0.4 mm, to about 0.37 mm, and further to about 0.3 mm.

On the other hand, the width of the resin bottom surface 13e differs from the longitudinal terminal portion towards the wall portion 13b, that is to say, the width decreases towards the wall portion 13b, and the resin bottom surface 13e is not provided on the bottom surface 13g of the opening 13a in proximity to the wall portion 13b, only the lead frames 12a, 12b are exposed. For example, the width decreases from about 0.05 mm to about 0.015 mm.

In the opening, respective light emitting elements 11a, 11b are mounted on the lead frames 12a, 12b exposed on the bottom surface 13g of the opening 13a, and the lead frames 12a, 12b are connected by a wire to one of the electrodes of the light emitting elements to act as an electrode. Furthermore light emitting elements 11a, 11b are connected electrically by a wire 14 that straddles the wall portions 13b.

Figure 4B:
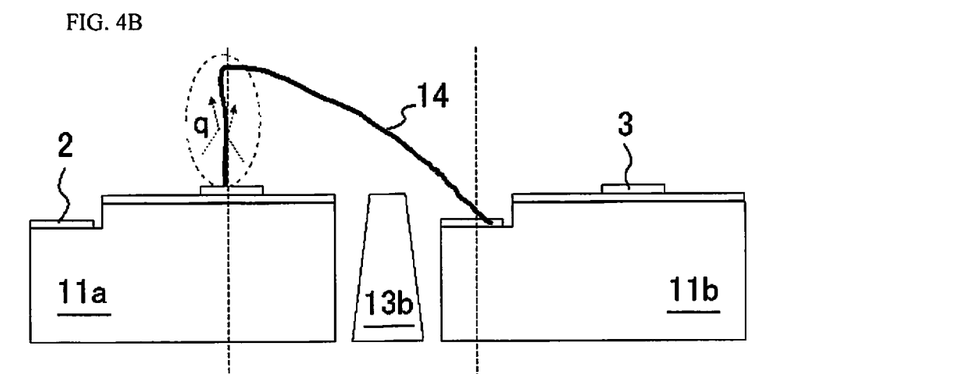

The wire 14 is a silver alloy wire having a diameter of about 18 to 30 micrometers, and in particular, the highest position of the wire 14 is biased towards one of the light emitting elements at the bonding between the electrodes of the light emitting elements 11a, 11b (see 14 in FIG. 4A and FIG. 4B). In particular, the light emitting elements used here are such that one of the pad electrodes that act as a bonding point is provided in proximity to the outer periphery of the light emitting element, and the other pad electrode is biased towards the inner side of the light emitting element. Therefore, bonding is provided between the pad electrode in proximity to the outer periphery of the light emitting element 11b and the pad electrode that is biased towards the inner side of the light emitting element 11a. In this manner, the wire 14 is wire-bonded in a shape that corresponds to two sides of a triangle, and the highest position of the wire 14 is biased towards the side of the light emitting element 11b that is bonded to the pad electrode provided in proximity to the outer periphery (see 14 in FIG. 1B and FIG. 4A).

Although this is not illustrated in the figures, the light emitting device 10 includes a protective element that is electrically connected to the lead frames 12a, 12b in an inner portion of the package 13. The protective element may be a Zener diode for example, and may be disposed on the surface that is opposite to the lead frames 12a, 12b on which the light emitting elements are mounted. Furthermore, a wire that is connected to the protective element is preferably disposed in an inner portion of the package between the lead frame 12a and the lead frame 12b. In particular, when the wall portion is disposed from between the lead frames onto the lead frames, this configuration enables the wire connected to the Zener diode to be shortened, and thereby reduces the possibility of wire disconnection. Furthermore, this configuration is less subjected to influence of thermal expansion of the translucent resin, and it is possible to enhance prevention of bending or peeling of the Zener diode.

The light emitting device enables effective prevention of sulfuration since the exposed position of the lead frame and the exposed position of the resin are disposed with a specific width at a specific position, and as described above, even when a gap or peeling is produced between the translucent resin and the package resin at the opening side surface, the metal member is not affected by external air, moisture or the like that enters from the gap because the metal member that contains silver is not present in the interface between the resins. Therefore, absorption of light from the light emitting element resulting from sulfuration of the metal member can be prevented, and a high intensity light emitting device can be provided.

Furthermore, the provision of the wall portion in the opening enables partition of the space in the opening and therefore enables effective moderation of the stress on the wire, the light emitting element or the like that is caused by thermal expansion or contraction of the translucent resin embedded in the opening.

In other words, the light emitting device of the present embodiment has a structure which effectively prevents the occurrence of a gap between the resin and the resin, the resin and the lead frame, wire or the like. Therefore, sulfuration of the metal member that contains silver used in the light emitting device can be inhibited, and thereby a high intensity light emitting device that can more efficiently extract light emitted from light emitting elements due to its structure and operation is provided. Furthermore, the light emitting device realizes reductions in size and thickness, and therefore enhances the level of freedom of combination with other electronic devices.

INDUSTRIAL APPLICABILITY

The light emitting device according to the present embodiment may for example mount a light emitting diode chip as a light emitting element for use as a surface-mounted light emitting device that emits light from the side surface of the package towards a side direction for use in illumination devices used in image scanning devices such as facsimiles, copying machines, hand scanners or the like, in addition to use in relation to various types of illumination devices including backlight sources such as illumination light sources, LED displays, mobile telephones or the like, signaling devices, illumination switches, vehicle-mounted stop lamps, various types of sensors, and various types of injectors, or the like.

What is claimed is:

1. A light emitting device comprising:
a plurality of light emitting elements;
a plurality of lead frames on which the light emitting elements are mounted; and
a package made of a resin, the package having an opening defined by a pair of long side surfaces, a pair of short side surfaces and a bottom surface, a part of the lead frames being embedded in an inner portion of the package and another part of the lead frames being exposed on the bottom surface of the opening,
wherein the bottom surface of the opening of the package includes a resin bottom surface made of the resin, the resin bottom surface being disposed adjacent to or along at least one of the long side surfaces of the opening,
the package includes a wall portion projecting from the bottom surface of the opening between the light emitting elements in the opening, the wall portion being spaced apart from the resin bottom surface, and
the light emitting elements are connected by a wire that straddles the wall portion.

2. The light emitting device according to claim 1, wherein the package is provided along a longitudinal direction and a transverse direction, and a width of the resin bottom surface in the transverse direction changes along the longitudinal direction.

3. The light emitting device according to claim 1, wherein a width of the resin bottom surface decreases as a distance between the resin bottom surface and the wall portion decreases.

4. The light emitting device according to claim 1, wherein the wall portion has a height that is equal to or lower than a height of the light emitting elements.

5. The light emitting device according to claim 1, wherein the resin bottom surface is disposed adjacent to at least one of the long side surfaces.

6. The light emitting device according to claim 1, wherein the wall portion is connected to the long side surfaces provided along a longitudinal direction at the opening extending in the longitudinal direction, and a width of the wall portion in the longitudinal direction increases as a distance to the bottom surface decreases.

7. The light emitting device according to claim 1, wherein a position on the bottom surface of the opening of the package adjacent to the wall portion is occupied by exposed surfaces of the lead frames.

8. The light emitting device according to claim 1, wherein the wall portion is disposed between the lead frames.

9. The light emitting device according to claim 1, wherein the wall portion is disposed from between the lead frames onto the lead frames.

10. The light emitting device according to claim 1, further comprising
a translucent resin embedded in the opening, a coefficient of elasticity of the translucent resin being no greater than 10 MPa.

11. The light emitting device according to claim 1, wherein
one of the light emitting elements has a first wire bonding point adjacent to an outer periphery,
another of the light emitting elements has a second wire bonding point that is biased towards an inner side of a light emitting region,
the first wire bonding point is adjacent to the wall portion, and the wire straddles the wall portion to be bonded with the second wire bonding point, and
a highest position of the wire is biased towards a side of the light emitting element having the first wire bonding point.

12. The light emitting device according to claim 1, wherein
one of the light emitting elements has a first wire bonding point adjacent to an outer periphery,
another of the light emitting elements has a second wire bonding point that is biased towards an inner side of a light emitting region,
the first wire bonding point is adjacent to the wall portion, and the wire straddles the wall portion to be bonded with the second wire bonding point, and
a highest position of the wire is biased towards a side of the light emitting element having the second wire bonding point.

13. The light emitting device according to claim 1, wherein the wire is made of silver or a silver alloy.

14. A light emitting device comprising:
a plurality of light emitting elements;
a plurality of lead frames on which the light emitting elements are mounted; and
a package made of resin, the package having an opening, a part of the lead frames being embedded in an inner portion of the package and another part of the lead frames being exposed on a bottom surface of the opening,
wherein the package includes a wall portion projecting from the bottom surface of the opening between the light emitting elements in the opening,
the light emitting elements are connected by a wire that straddles the wall portion, with the wire being made of silver or a silver alloy,
one of the light emitting elements has a first wire bonding point adjacent to an outer periphery,
another of the light emitting elements has a second wire bonding point that is biased towards an inner side of a light emitting region,
the first wire bonding point is adjacent to the wall portion, and the wire straddles the wall portion to be bonded with the second wire bonding point, and
a highest position of the wire is biased towards a side of the light emitting element having the first wire bonding point.

15. The light emitting device according to claim 14, wherein
the wall portion has a height that is equal to or lower than a height of the light emitting elements.

16. The light emitting device according to claim 14, wherein
the wall portion is connected to a pair of long side surfaces provided along a longitudinal direction at the opening extending in the longitudinal direction, and a width of the wall portion in the longitudinal direction increases as a distance to the bottom surface decreases.

17. The light emitting device according to claim 14, wherein
the wall portion has a pair of side surfaces that are inclined with respect to the bottom surface of the opening with an angle of inclination of the side surfaces being about 40 to 70 degrees.

18. The light emitting device according to claim 17, wherein
the angle of inclination of the side surfaces is about 50 to 60 degrees.

19. The light emitting device according to claim 14, wherein
a position on the bottom surface of the opening of the package adjacent to the wall portion is occupied by exposed surfaces of the lead frames.

20. The light emitting device according to claim 14, wherein
the wall portion is disposed between the lead frames.

21. The light emitting device according to claim 14, wherein
the wall portion is disposed from between the lead frames onto the lead frames.

22. The light emitting device according to claim 14, further comprising
a translucent resin embedded in the opening, a coefficient of elasticity of the translucent resin being no greater than 10 MPa.

23. The light emitting device according to claim 1, wherein
the wire is directly connected to each of the light emitting elements.

24. The light emitting device according to claim 1, wherein
the light emitting elements are mounted on the part of the lead frames exposed on the bottom surface of the opening.

25. The light emitting device according to claim 14, wherein
the wire is directly connected to each of the light emitting elements.

26. The light emitting device according to claim 14, wherein
the light emitting elements are mounted on the part of the lead frames exposed on the bottom surface of the opening.

27. The light emitting device according to claim 5, wherein
a width of the resin bottom surface varies with respect to the longitudinal direction of the opening.

* * * * *